(12) United States Patent
Quoc et al.

(10) Patent No.: US 8,673,410 B2
(45) Date of Patent: Mar. 18, 2014

(54) ADHESION LAYER FOR THIN FILM TRANSISTORS

(75) Inventors: Hai Tran Quoc, Orsay (FR); Jerome Villette, Le Plessis Robinson (FR)

(73) Assignee: Tel Solar AG, Trubbach (CH)

( * ) Notice: Subject to any disclaimer, the term of this patent is extended or adjusted under 35 U.S.C. 154(b) by 1138 days.

(21) Appl. No.: 11/573,162

(22) PCT Filed: Jul. 28, 2005

(86) PCT No.: PCT/CH2005/000450
§ 371 (c)(1),
(2), (4) Date: Jun. 14, 2007

(87) PCT Pub. No.: WO2006/012766
PCT Pub. Date: Feb. 9, 2006

(65) Prior Publication Data
US 2007/0254165 A1    Nov. 1, 2007

(51) Int. Cl.
*H05H 1/24* (2006.01)
*B05D 5/12* (2006.01)
*C23C 16/00* (2006.01)
*B05D 3/04* (2006.01)
*C23C 16/24* (2006.01)

(52) U.S. Cl.
CPC ...................................... *C23C 16/24* (2013.01)
USPC ........ 427/578; 427/74; 427/249.15; 427/344; 427/58; 427/69

(58) Field of Classification Search
CPC ............................... C23C 16/272; C23C 16/24
USPC ...................................... 438/486; 427/579, 78
See application file for complete search history.

(56) References Cited

U.S. PATENT DOCUMENTS

| | | | |
|---|---|---|---|
| 4,044,394 A * | 8/1977 | Hanazono et al. | 360/123.01 |
| 5,177,578 A * | 1/1993 | Kakinoki et al. | 257/64 |
| 5,409,867 A * | 4/1995 | Asano | 438/487 |
| 5,677,236 A * | 10/1997 | Saitoh et al. | 438/485 |
| 5,834,796 A * | 11/1998 | Matsuda et al. | 257/57 |
| 5,869,389 A * | 2/1999 | Ping et al. | 438/486 |
| 6,232,208 B1 * | 5/2001 | Wu et al. | 438/585 |
| 6,346,731 B1 * | 2/2002 | Nakajima et al. | 257/381 |
| 6,479,166 B1 * | 11/2002 | Heuer et al. | 428/620 |
| 2002/0197831 A1 * | 12/2002 | Todd et al. | 438/528 |

OTHER PUBLICATIONS

Paillard et al. "Measurement of the in depth stress profile in hydrogenated microcrystalline silicon thin films using raman spectrometry" Oct. 1, 2001, Journal of App. phys. Vo. 90, No. 7.*

* cited by examiner

*Primary Examiner* — Elizabeth Burkhart
*Assistant Examiner* — Mandy Louie
(74) *Attorney, Agent, or Firm* — Pearne & Gordon LLP

(57) ABSTRACT

A method for manufacturing a poly- or microcrystalline silicon layer on an insulator comprises a silicon containing insulator, growing a thin adhesion promoting layer comprising amorphous silicon onto it and further growing a poly- or microcrystalline silicon layer onto the adhesion promoting layer. Such a sequence of layers, deposited with a PECVD method, shows good adhesion of the poly- or microcrystalline silicon on the base and is advantageous in the production of semiconductors, such as thin film transistors.

7 Claims, 1 Drawing Sheet

ADHESION LAYER FOR THIN FILM TRANSISTORS

CROSS REFERENCE TO RELATED APPLICATION

This application is a 371 of PCT/CH2005/000450, which was published in English.

This invention describes a method and process to obtain excellent adhesion between a microcrystalline silicon layer and a silicon containing insulator in a PECVD process and simultaneously obtain a low rate of electronic defects at the interface.

BACKGROUND OF THE INVENTION

The present invention relates to the production of semiconductors in general and to the production of thin film transistors (TFT) by a plasma enhanced chemical vapor deposition (PECVD) process in particular. Such semiconductors may be employed in a variety of electronic devices such as in LCD displays, in solar cells or in organic light emitting displays (OLED's) and many more. In today's transistors, amorphous silicon (a-Si) is most commonly used as semi conducting material and it is often deposited by a PECVD process on top of an insulator (dielectric). Unfortunately however, a-Si has relatively poor electronic properties and a-Si based devices (such as TFTs) tend to show degeneration over time. It is known in the art that microcrystalline silicon (μc-Si, also "polycrystalline silicon") has far better electronic properties and that devices made of more crystalline material exhibit better performance such as higher electron mobility (higher field effect mobility), higher on—current, and tend to degenerate less over time (have less voltage threshold shift). It is also known in the art that both a-Si and μc-Si can be deposited onto an insulator from precursor silicon containing gasses in a PECVD process. For example, Y. Park et. al. in the Journal of Applied Physics (Vol. 90, No. 1, Jul. 2001, p 217) report several efforts and methods for growing μc-Si. The problem inherent to all these known methods is that they are either too slow—and thus economically not viable—or that they lead to a poor interface between the μc-Si and the insulator with unsatisfying electronical and mechanical properties.

SUMMARY OF THE INVENTION

The present invention teaches how to grow a μc-Si layer on an insulator from mixtures of silicon containing gasses (SCG) and from halogen containing gasses (HCG) by providing a very thin intermediate a-Si layer on top of the insulator. This very thin intermediate a-Si layer essentially serves as an adhesion layer and thus dramatically improves the μc-Si/insulator interface. The μc-Si sticks much better to the insulator than what can be achieved by prior art and which is crucial for large area devices such as solar cells and displays.

Furthermore, the economically successful manufacturing process of a TFT with amorphous silicon as an active layer demands 1) the possibility to use present day manufacturing equipment (such as existing PECVD reactors) and 2) relatively low process temperatures to allow production on present day substrates (such as glass) or even the polymeric substrates which are expected for upcoming display technologies. The present invention provides a solution under both of these limitations.

RELATED ART

U.S. Pat. No. 6,326,297 teaches how to make a tungsten nitride barrier layer with improved adhesion and stability by forming a thin layer of silicon over the dielectric before depositing the tungsten nitride.

U.S. Pat. No. 5,177,578 teaches how to grow polycrystalline or microcrystalline silicon by a PECVD process from precursor gasses such as SiF4, SiH4, H2 and noble gasses, and how to make transistors from said polycrystalline. The advantages of using microcrystalline (or polycrystalline) silicon as opposed to amorphous silicon are emphasized.

P. Roca i Cabarroca et al., in Journal of SID Dec. 1, 2004, present the use of μc-Si films deposited from SiF4-Ar—H2 plasma in inverted staggered top-gate and bottom gate microcrystalline-Si TFTs. In particular, they demonstrate that in the case of bottom gate μc-Si TFTs, the aggressive plasma conditions required to achieve a highly crystalline material can lead to defect formation in the dielectric and thus to instability in the TFT characteristics (i.e. to threshold voltage shift).

Roca et al. have successfully achieved TFTs with high mobility by applying plasma treatment to the SiN layer prior to microcrystalline Si deposition. They have shown that non-depositing plasma treatment (Ar, N2 for ex.) of the interface can control the growth kinetic of the microcrystalline layer.

Young-Bae Park, and Shi-Woo Rhee, in Journal of Applied Physics, Vol. 90, No. 1, Jul. 2001 describe the influence of the N/Si ratio (for the SiN dielectric) on the initial growth of the microcrystalline silicon.

EP 0 714 140 and others more teach how to form micro (or poly-) crystalline silicon by recrystallisation of originally amorphous silicon (by laser irradiation or heating for example).

By using a-Si as the intrinsic semiconductor in the device one usually observes degeneration in the form of voltage threshold shift. This is why many efforts are being made to replace amorphous active layers by more crystalline ones (μc-Si and polycrystalline Si). Many known processes, which use μc-Si instead of a-Si however, generally need to make use of etching radicals (fluorine for example). Especially processes with satisfying deposition rates of μc-Si and high crystallinity require aggressive plasma conditions. It is also known however, that using fluorine containing precursors as feeding gas generally leads to poor adhesion of the μc-Si layer on the dielectric. Moreover, aggressive plasma conditions are known to damage the underlying dielectric layer.

DETAILED DESCRIPTION OF THE INVENTION

Figure 1:
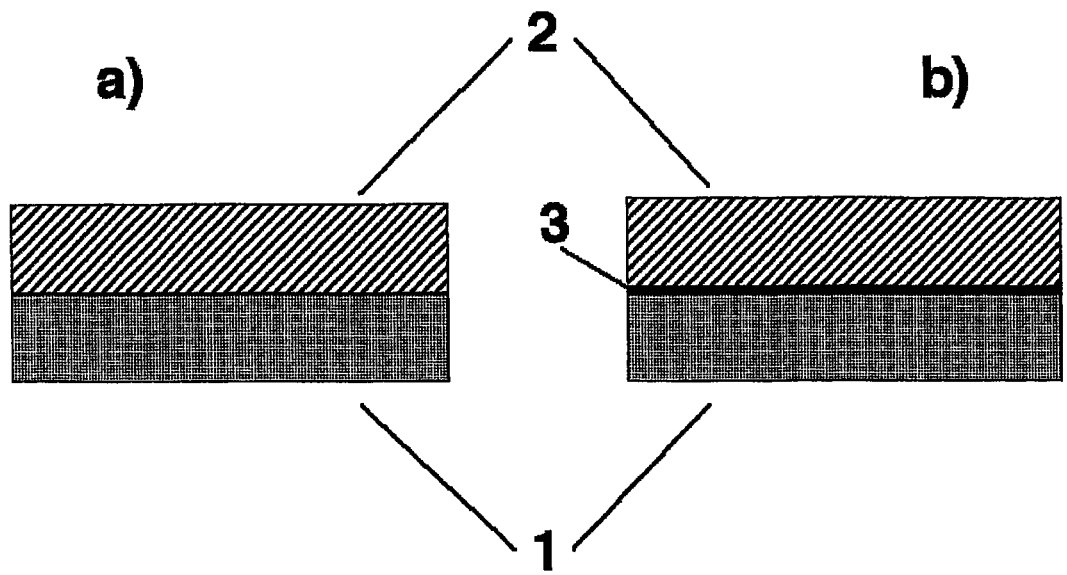
FIG. 1 a) shows an embodiment according to Prior Art with an Si containing insulator and a μc- or polycristalline silicon layer FIG. 1 b) shows an embodiment according to the invention comprising an adhesion promoting layer

Referring to FIG. 1, the present invention describes how to grow a microcrystalline (or polycrystalline-) silicon layer 2 on top of a silicon containing insulator 1, by first providing an adhesion promoting layer 3. Both the adhesion promoting layer according to the invention and the microcrystalline layer can be deposited by plasma enhanced chemical vapor deposition (PECVD) in conventional equipment. The insulator upon which the adhesion layer is deposited can be any insulator, but typically is chosen from silicon oxide, silicon nitride, or silicon oxynitride (SiOx, SiNy, SiOxNy) or combinations thereof.

The adhesion layer 3 according to the present invention is made of amorphous silicon (a-Si:H), which is deposited by a low deposition rate (LDR) PECVD process. This adhesion layer is very thin and may have a thickness in the range of a monolayer (about 5 Å) up to about 200 Å. Preferably the thickness of the adhesion layer is below 10 Å because higher thicknesses, especially above 50 Å, deteriorate the performance of any transistors which would be built with the adhesion layer according to the present invention. If the thickness of the amorphous adhesion layer according to the present invention exceeds the corresponding depletion depth however, the current will be bound to travel in the amorphous adhesion layer instead of in the microcrystalline layer as desired. In other words, everything would be the same as in a conventionally amorphous Si transistor.

EXAMPLE 1

Adhesion Layer

In a Unaxis KAI 1 XL PECVD system running at 13.56 MHz, $SiH_4$ (with a partial pressure below 0.3 mbar) and $H_2$ are injected with a mass flow ratio $SiH_4/H_2=¼$ and an RF power of 100 W (electrode area was 5000 cm2). These parameters lead to a LDR process of amorphous silicon, with a RF power below 30 mW/cm2 and a deposition rate below 2.5 Å/s. The optimum thickness is between a monolayer (about 5 Å) and about 10 Å.

After having deposited the adhesion layer according to the invention, the microcrystalline silicon may be deposited in the generally same system without breaking vacuum and with techniques and recipes known in the art and which are described in the following example:

EXAMPLE 2

Microcrystalline Silicon

A deposition gas mixture comprising in greater part of a fluorine rich silicon (typically $SiF_4$) gas and of hydrogen ($H_2$) gas and an inert gas (typically Ar) with a $SiF_4/H_2$ ratio in the range from 1:1 to about 1:10 and a $SiF_4$/inert gas ratio from 1:10 to about 1:30 deposits a microcrystalline silicon layer at a rate of approximately 1 Å per second. This leads to a microcrystalline layer having an internal compressive stress, typically ranging from 0 to 900 MPa.

By applying the adhesion layer according to the present invention to a large area substrate, the microcrystalline silicon layer showed excellent adhesion to the insulator and did not show any of the usual peel-off phenomena which were observed under exactly the same conditions without applying said adhesion layer first. The µc-Si layer even resisted peeling-off when a tape was applied to it and then torn off ("tape-test"):

EXAMPLE 3

Figure 2:
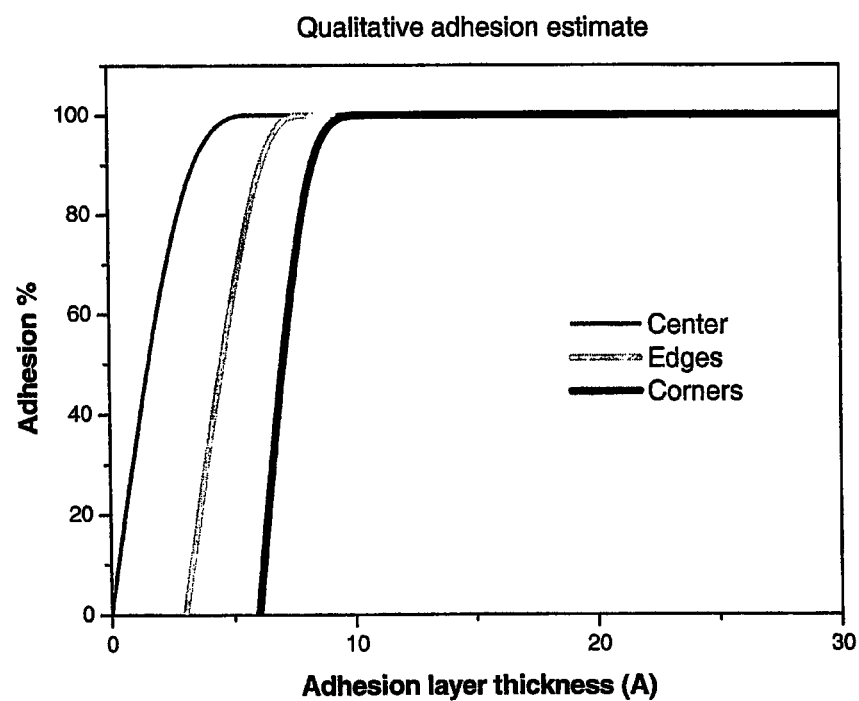
FIG. 2 shows an estimate of the variation of the μc-Si layer adhesion observed at significant substrate positions.

A strip of 3M SCOTCH™ (855-2MFH-1631-502E, 25 mm) tape of about 10 cm length is applied to a microcrystalline Si layer which was deposited onto SiN on top of a glass substrate. It was then smoothed with a rubber eraser and subsequently pulled off gently. Adhesion can then be estimated by comparing the overall surface of the tape with the removed (peeled off) area of the layer. While only qualitative, this method shows reproducible results and allows for a clear distinction between good and unsatisfactory adhesion. FIG. 2 shows an estimate of the variation of the µc-Si layer adhesion observed at significant substrate positions.

Further Advantages of the Invention

The adhesion layer of the present invention provides a reliable method to grow µc-Si upon an insulator in commercially available, present day PECVD equipment. Because the adhesion layer is very thin, it provides an economically viable production method and does not influence the electrical properties of the insulator/conductor interface. Said adhesion layer not only significantly improves the mechanical adhesion of the µc-Si on an insulator, but also serves as a protection layer when the process gas is switched to $SiF_4$. In PECVD processes under the above mentioned conditions, silicon and fluorine containing gasses (such as $SiF_4$) are known to be both simultaneously, deposition- and etching agents. By depositing the adhesion layer according to the present invention before switching to silicon and fluorine containing gasses, the underlying insulator is protected as the rapid growth of the microcrystalline does not lengthly expose the interface to etching fluorine radicals. This significantly improves the overall insulator/semiconductor interface and leads to superior electric properties. The density of defects in the conductor/insulator interface is crucial for the electrical transport properties of the device.

Furthermore, by purposely depositing a thin amorphous Si layer according to the invention, the number of sites where nucleation of microcrystalline silicon occurs may be favorably increased. This allows for an immediate and early growth of the crystalline material and thus reduces the well known, undesired and large amorphous incubation zone which usually occurs in PECVD microcrystalline deposition otherwise known in the art (see P. Roca i Cabarroca et al. for ex.).

The invention claimed is:

1. A method for manufacturing a microcrystalline silicon layer on an insulator, the method comprising:
   Providing a silicon-containing insulator;
   Growing a thin adhesion-promoting layer comprising amorphous silicon having a thickness that is equal to or greater than 5 Å and less than 10 Å; and
   Growing a microcrystalline silicon layer onto the adhesion-promoting layer to result in a microcrystalline silicon layer having an internal compressive stress below 900 Mpa.

2. The method according to claim 1, wherein the thin adhesion-promoting layer is deposited by a low deposition rate (LDR) PECVD process comprising silane ($SiH_4$).

3. The method according to claim 1, wherein the thin adhesion-promoting layer and the microcrystalline layer are grown in the same deposition system without breaking vacuum.

4. The method according to claim 1, wherein the microcrystalline layer is deposited onto said adhesion-promoting layer by PECVD using a mixture of a silicon containing gas, a halogen containing gas and hydrogen.

5. The method according to claim 4, wherein during deposition further a noble gas is being introduced.

6. The method according to claim 1, wherein the insulator is chosen from the group of silicon oxide, silicon nitride, or silicon oxynitride ($SiO_x$, $SiN_y$, $SiO_xN_y$) or combinations thereof.

7. The method according to claim 1, wherein said microcrystalline silicon layer is grown on top of said insulator to form part of a thin film transistor (TFT).

* * * * *

UNITED STATES PATENT AND TRADEMARK OFFICE
CERTIFICATE OF CORRECTION

| | |
|---|---|
| PATENT NO. | : 8,673,410 B2 |
| APPLICATION NO. | : 11/573162 |
| DATED | : March 18, 2014 |
| INVENTOR(S) | : Hai Tran Quoc |

Page 1 of 1

It is certified that error appears in the above-identified patent and that said Letters Patent is hereby corrected as shown below:

On the Title page, please add item (60) Related U.S. Application Data to include Provisional application No. 60/598,599, filed on Aug. 4, 2004.

Signed and Sealed this
Seventeenth Day of June, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,673,410 B2  Page 1 of 1
APPLICATION NO. : 11/573162
DATED : March 18, 2014
INVENTOR(S) : Quoc et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 930 days.

Signed and Sealed this

Twenty-ninth Day of September, 2015

Michelle K. Lee
*Director of the United States Patent and Trademark Office*